(12) United States Patent
Takahashi

(10) Patent No.: US 10,453,887 B2
(45) Date of Patent: Oct. 22, 2019

(54) SOLID-STATE IMAGE SENSING DEVICE, MANUFACTURING METHOD, AND ELECTRONIC APPARATUS

(71) Applicant: SONY CORPORATION, Tokyo (JP)

(72) Inventor: Shingo Takahashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/741,365

(22) PCT Filed: Jun. 24, 2016

(86) PCT No.: PCT/JP2016/068783
§ 371 (c)(1),
(2) Date: Jan. 2, 2018

(87) PCT Pub. No.: WO2017/010263
PCT Pub. Date: Jan. 9, 2017

(65) Prior Publication Data
US 2019/0006410 A1    Jan. 3, 2019

(30) Foreign Application Priority Data

Jul. 10, 2015 (JP) .................................. 2015-138433

(51) Int. Cl.
*H01L 27/146* (2006.01)
*H01L 21/285* (2006.01)
(Continued)

(52) U.S. Cl.
CPC ...... *H01L 27/14636* (2013.01); *C23C 14/025* (2013.01); *C23C 14/165* (2013.01);
(Continued)

(58) Field of Classification Search
CPC ... H01L 27/14636; H01L 24/05; H01L 24/03; H01L 2224/0401; H01L 2224/05082;
(Continued)

(56) References Cited

U.S. PATENT DOCUMENTS 9,293,367 B2 * 3/2016 Sulfridge .............. H01L 21/288
9,728,579 B2 * 8/2017 Toda .................. H01L 27/14612
(Continued)

FOREIGN PATENT DOCUMENTS

JP 04-256313 A 9/1992
JP 05-129296 A 5/1993
(Continued)

*Primary Examiner* — Alexander O Williams
(74) *Attorney, Agent, or Firm* — Chip Law Group

(57) ABSTRACT

The present disclosure relates to a solid-state image sensing device, a manufacturing method, and an electronic apparatus, in which surface roughness on a wiring surface can be suppressed. In redistribution layer forming processing, a Ti/Cu film corresponds to a barrier layer and a seed layer is formed by Ti/Cu sputtering after opening a through-silicon via. At this point, actually, degassing heating, reverse sputtering, Ti deposition, and Seed-Cu deposition are sequentially performed. As a method of depositing a Seed-Cu film having high crystallinity in deposition of the Seed-Cu film, performing deposition by increasing a substrate temperature to a high temperature is one method, and the Seed-Cu film of Cu(111)/(200) is formed by performing deposition at the substrate temperature of 60 degrees or more, and Cu haze are suppressed. The present disclosure can be applied to a CMOS solid-state image sensing device used as an imaging device such as a camera.

9 Claims, 10 Drawing Sheets

(51) Int. Cl.
*H01L 21/3205* (2006.01)
*H01L 21/768* (2006.01)
*H01L 27/14* (2006.01)
*C23C 14/16* (2006.01)
*H01L 23/00* (2006.01)
*C23C 14/02* (2006.01)
*C23C 14/34* (2006.01)
*C23C 14/54* (2006.01)
*H04N 5/341* (2011.01)
*H04N 5/365* (2011.01)
*H04N 5/376* (2011.01)

(52) U.S. Cl.
CPC ........ *C23C 14/345* (2013.01); *C23C 14/3492* (2013.01); *C23C 14/541* (2013.01); *H01L 21/285* (2013.01); *H01L 21/3205* (2013.01); *H01L 21/768* (2013.01); *H01L 24/03* (2013.01); *H01L 24/05* (2013.01); *H01L 27/14* (2013.01); *H01L 27/146* (2013.01); *H01L 27/14683* (2013.01); *H01L 2224/0345* (2013.01); *H01L 2224/0346* (2013.01); *H01L 2224/0401* (2013.01); *H01L 2224/05008* (2013.01); *H01L 2224/05082* (2013.01); *H01L 2224/05147* (2013.01); *H01L 2224/05166* (2013.01); *H04N 5/341* (2013.01); *H04N 5/365* (2013.01); *H04N 5/3765* (2013.01)

(58) Field of Classification Search
CPC ... H01L 2224/05166; H01L 2224/0346; H01L 2224/0345; H01L 2224/050008; H01L 27/16; H01L 23/00; C23C 24/165; C23C 14/16; H04N 5/341; H04N 5/365; H04N 5/3765
USPC .......................................................... 257/459
See application file for complete search history.

(56) References Cited

U.S. PATENT DOCUMENTS 9,729,809 B2 * 8/2017 Kurokawa ........ H01L 27/14609
2013/0256824 A1 * 10/2013 Mizuta ................ H01L 27/1464
257/459

FOREIGN PATENT DOCUMENTS

| JP | 06-275617 A | | 9/1994 | |
|---|---|---|---|---|
| JP | 10-93160 | * | 4/1998 | ............. H01L 49/00 |
| JP | 10-093160 A | | 4/1998 | |
| JP | 2000-183064 A | | 6/2000 | |
| JP | 2008-183064 | * | 6/2000 | ......... H01L 21/3205 |
| JP | 2000-269217 | * | 9/2000 | ......... H01L 21/3205 |
| JP | 2000-269217 A | | 9/2000 | |
| JP | 2011-187754 | * | 9/2011 | ............. H01L 27/14 |
| JP | 2011-187754 A | | 9/2011 | |
| JP | 2013-26367 | * | 2/2013 | ............. H01L 23/12 |
| JP | 2013-026367 A | | 2/2013 | |
| WO | 2008/084867 A1 | | 7/2008 | |
| WO | 2008084867 A1 | * | 7/2008 | ....... H01L 21/76843 |

* cited by examiner

SOLID-STATE IMAGE SENSING DEVICE, MANUFACTURING METHOD, AND ELECTRONIC APPARATUS

CROSS REFERENCE TO RELATED APPLICATIONS

This application is a U.S. National Phase of International Patent Application No. PCT/JP2016/068783 filed on Jun. 24, 2016, which claims priority benefit of Japanese Patent Application No. JP 2015-138433 filed in the Japan Patent Office on Jul. 10, 2015. Each of the above-referenced applications is hereby incorporated herein by reference in its entirety.

TECHNICAL FIELD

The present disclosure relates to a solid-state image sensing device, a manufacturing method, and an electronic apparatus, and particularly, relates to a solid-state image sensing device, a manufacturing method, and an electronic apparatus, in which surface roughness of a wiring surface can be suppressed.

BACKGROUND ART

In Patent Document 1, proposed is an oxidation resistant copper thin film in a semiconductor device having a copper wiring film on a semiconductor element via an insulation layer in order to suppress oxidation/corrosion of copper wiring of the semiconductor device having wiring of a copper thin film, in which the wiring film includes a copper face (111) on which a surface layer thereof is oriented, and is characterized in that a strength ratio of the face (111)/a face (200) at a diffraction peak of the face based on an XRD θ/2θ method is 20 or more.

CITATION LIST

Patent Document

Patent Document 1: Japanese Patent Application Laid-Open No. 6-275617

SUMMARY OF THE INVENTION

Problems to be Solved by the Invention

However, in a case of using above-described Cu as a seed layer at the time of forming a Cu redistribution layer in a chip size package of a wafer level, noticeable surface roughness is generated on the Cu wiring. Such surface roughness may cause a defect in mask alignment in a lithography process after forming the redistribution layer.

The present disclosure is made in view of the above-described situation and is capable of suppressing surface roughness of a wiring surface.

Solutions to Problems

A solid-state image sensing device according to an aspect of the present technology includes, as a redistribution layer, a barrier layer and a plated power supply layer, in which crystallinity of a film of the plated power supply layer is controlled at the time of depositing a film of the barrier layer and the film of the plated power supply layer.

The film of the barrier layer is a Ti film, and the film of the plated power supply layer is a Cu film.

The Cu film is highly oriented to Cu(111).

The Cu film can have crystallinity having a strength ratio ≥200 of Cu(111)/Cu(200).

The Cu film is deposited at a substrate temperature of 60 degrees or more.

The substrate temperature can be increased by heating the substrate temperature to 60 degrees or more.

The substrate temperature can be increased by setting target power to high power.

The substrate temperature can be increased by applying bias to the substrate to cause sputter ions entering the substrate to have high energy.

The Ti film is highly oriented to Ti(002), and the Cu film is deposited on the Ti film.

In a manufacturing method according to an aspect of the present technology, crystallinity of a film of a plated power supply layer is controlled when a manufacturing device of a solid-state image sensing device deposits a film of a barrier layer and the film of the plated power supply layer in a course of forming a redistribution layer.

An electronic apparatus according to one aspect of the present technology includes, as a redistribution layer, a barrier layer and a plated power supply layer, in which provided are: solid-state image sensing device in which crystallinity of a film of the plated power supply layer is controlled at the time of depositing a film of the barrier layer and the film of the plated power supply layer; a signal processing circuit adapted to process an output signal output from the solid-state image sensing device; and an optical system adapted to allow incident light to enter the solid-state image sensing device.

According to one aspect of the present technology, the crystallinity of the film of the plated power supply layer is controlled at the time of depositing the film of the barrier layer and the film of the plated power supply layer as the redistribution layer.

Effects of the Invention

According to the present technology, surface roughness of a wiring surface can be suppressed.

Note that the effects described in the present specification are merely examples, and the effects of the present technology are not limited to the effects described in the present specification and may have additional effects.

MODE FOR CARRYING OUT THE INVENTION

In the following, modes to implement the present disclosure (hereinafter referred to as "embodiment") will be described. Note that the description will be provided in the following order.
1. First Embodiment
2. Second Embodiment (Exemplary Uses of Image Sensor)
3. Third Embodiment (Example of Electronic Apparatus)

1. First Embodiment

<Schematic Exemplary Configuration of Solid-State Image Sensing Device>

Figure 1:
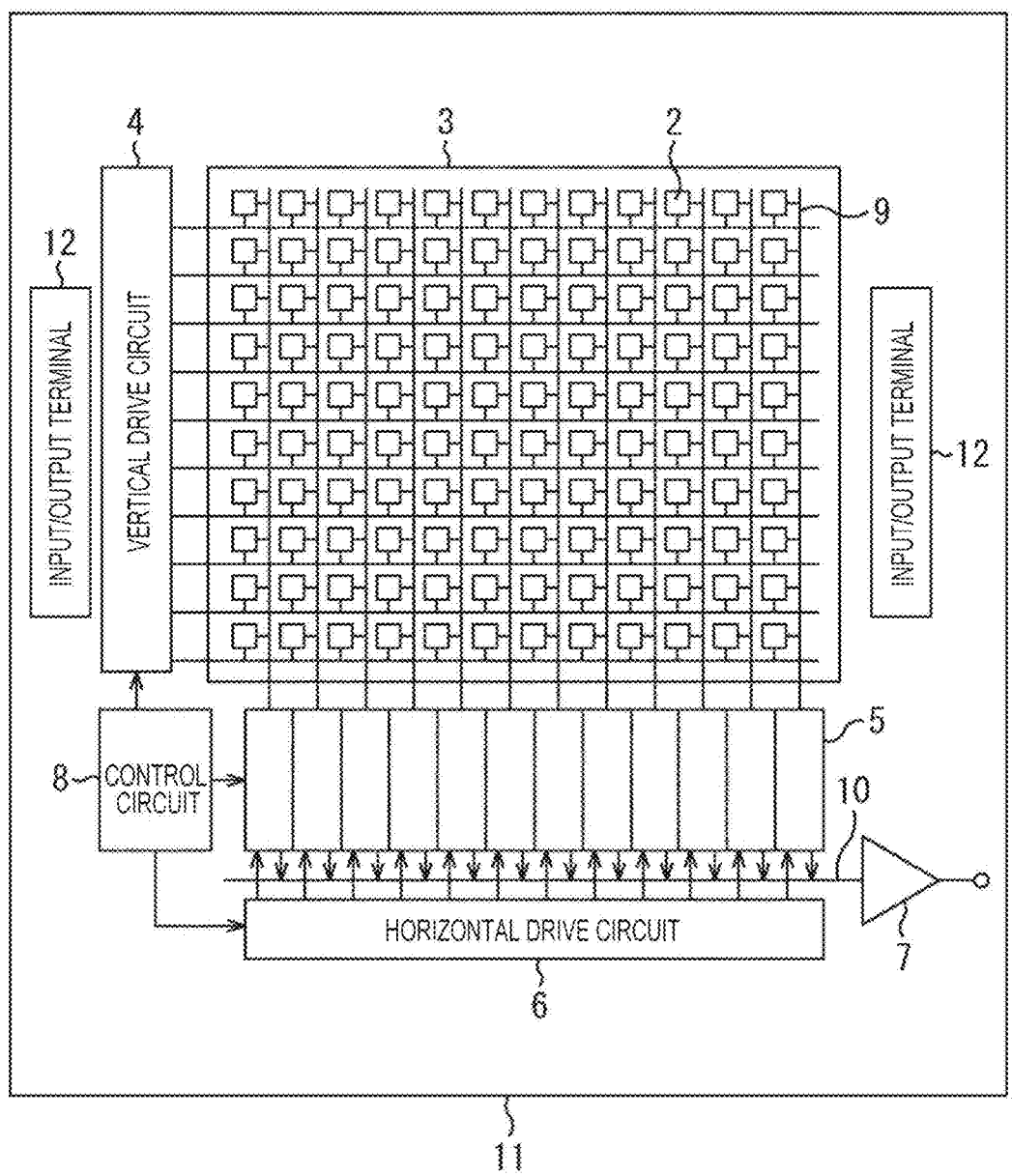
FIG. 1 is a block diagram illustrating a schematic exemplary configuration of a solid-state image sensing device to which the present technology is applied.

FIG. 1 illustrates a schematic exemplary configuration of a solid-state image sensing device of a complementary metal oxide semiconductor (CMOS) applied to each embodiment of the present technology.

As illustrated in FIG. 1, a solid-state image sensing device (element chip) 1 includes: a pixel region (so-called imaging region) 3 where a plurality of pixels 2 each including a photoelectric conversion element is regularly arrayed two-dimensionally on a semiconductor substrate 11 (for example, a silicon substrate); and a peripheral circuit portion.

The pixel 2 includes a photoelectric conversion element (for example, a photodiode) and a plurality of pixel transistors (so-called MOS transistors). The plurality of pixel transistors can include three transistors including, for example, a transfer transistor, a reset transistor, and an amplification transistor, and can also include four transistors by further adding a selection transistor. Since an equivalent circuit of each pixel 2 (unit pixel) is similar to a general type, a detailed description will be omitted here.

Furthermore, the pixel 2 can have a pixel sharing structure. The pixel sharing structure includes a plurality of photodiodes, a plurality of transfer transistors, one shared floating diffusion, and another shared pixel transistor in each. The photodiode is a photoelectric conversion element.

The peripheral circuit unit includes a vertical drive circuit 4, a column signal processing circuit 5, a horizontal drive circuit 6, an output circuit 7, and a control circuit 8.

The control circuit 8 receives an input clock and data to command an operation mode and the like, and also outputs data such as internal information of a solid-state image sensing device 1. Specifically, the control circuit 8 generates a clock signal and a control signal to be reference of operation of the vertical drive circuit 4, column signal processing circuit 5, and horizontal drive circuit 6 on the basis of a vertical synchronization signal, a horizontal synchronization signal, and a master clock. Then, the control circuit 8 transmits such signals in the vertical drive circuit 4, column signal processing circuit 5, and horizontal drive circuit 6.

The vertical drive circuit 4 includes a shift register, for example, and selects a pixel drive wire, supplies a pulse to the selected pixel drive wire in order to drive a pixel 2, and drives pixels 2 in row units. Specifically, the vertical drive circuit 4 selectively and sequentially scans each of the pixels 2 in the pixel region 3 in the row units in a vertical direction, and supplies the column signal processing circuit 5 with a pixel signal based on signal charge generated in accordance with a light receiving amount in a photoelectric conversion element of each pixel 2 via a vertical signal line 9.

The column signal processing circuit 5 is arranged per column of the pixels 2, for example, and adapted to apply, per pixel column, signal processing such as noise removal to signals output from the pixels 2 included in one row. Specifically, the column signal processing circuit 5 performs signal processing such as correlated double sampling (CDS), signal amplification, and analog/digital (A/D) conversion in order to remove fixed pattern noise peculiar to the pixel 2. An output stage of the column signal processing circuit 5 is provided with a horizontal selection switch (not illustrated) connected on the way to a horizontal signal line 10.

The horizontal drive circuit 6 includes a shift register, for example, and sequentially selects each of column signal processing circuits 5 and causes each of column signal processing circuits 5 to output a pixel signal to the horizontal signal line 10 by sequentially outputting horizontal scanning pulses.

The output circuit 7 applies signal processing to each of the signals sequentially supplied from the each of the column signal processing circuits 5 via the horizontal signal line 10, and outputs the signal applied with the signal processing. For example, the output circuit 7 may perform only buffering or may perform black level adjustment, correction of unevenness between columns, various kinds of digital signal processing, and the like.

An input/output terminal 12 is provided in order to exchange signals with the outside.
<CSP of Present Technology>

Figure 2:
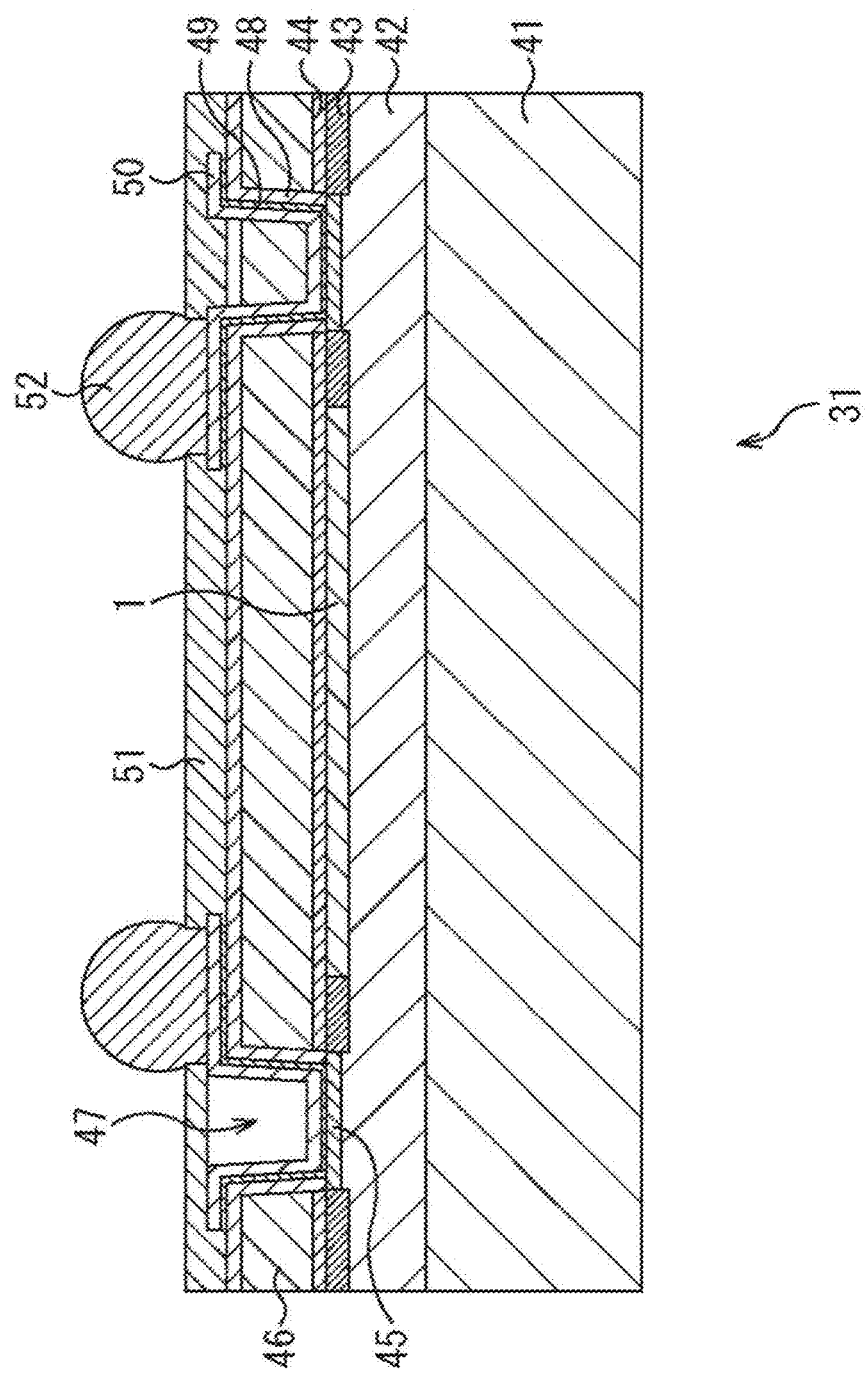
FIG. 2 is a diagram illustrating an exemplary cross section of a CSP including the solid-state image sensing device to which the present technology is applied.

FIG. 2 is a cross-sectional view illustrating an exemplary configuration of a solid-state image sensing device to which the present technology is applied. Note that an exemplary chip size package (CSP) on which the solid-state image sensing device 1 is mounted is illustrated in the example of FIG. 2.

A CSP 31 in the example of FIG. 2 has a structure in which a sensor substrate 43 on which the solid-state image sensing device 1 is mounted is bonded to a protection glass 41 in a wafer level by using a transparent adhesive resin 42 in a cavity-less structure, and a through-silicon via (TSV) 47 formed in an Si substrate 46 on a back side, a redistribution layer (Ti/Cu film 49 and plated Cu 50), and a solder ball 52 are used in order to achieve the CSP.

Specifically, the protection glass 41 is bonded, by using the transparent adhesive resin 42, to the sensor substrate 43 on which the solid-state image sensing device 1 is mounted. The protection glass 41 is used to protect a pixel surface (downward in the drawing) of the solid-state image sensing device 1. The solid-state image sensing device 1 and wiring 45 are formed on the sensor substrate 43. The Si substrate 46 is bonded to the back surface of the sensor substrate 43 via an interlayer film 44.

The through-silicon via 47 is formed in the Si substrate 46 and the interlayer film 44 after bonded to the sensor substrate 43 is finished. An insulation film 48 is formed on a side surface of the through-silicon via 47 and a surface of the Si substrate 46. The Ti/Cu film 49 and the plated Cu 50 are formed as the redistribution layer at a bottom of the through-silicon via 47 (surface of the wiring 45) and a part of the insulation film 48.

The Ti/Cu film 49 includes a Ti film that is a barrier layer and a Cu film that is a plated power supply layer (seed layer) (hereinafter also referred to as Seed-Cu film as appropriate for differentiation from the plated Cu). The plated Cu 50 is used as the redistribution layer. The solder ball 52 is formed on the plated Cu 50. Additionally, the insulation film 51 is formed so as to cover the insulation film 48, a part of the plated Cu 50, and the through-silicon via 47.

Here, Cu haze is caused by change of film quality (crystal orientation) of the Seed-Cu film due to heat treatment after a process of depositing the barrier layer (Ti film) and the plated power supply layer (Seed-Cu film) at the time of forming the redistribution layer in the CSP 31 having the above-described a structure. To solve Cu haze problem, it is necessary to form a Seed-Cu film in which change of a crystal structure hardly occurs even in a case where heat treatment is applied, and to achieve such a film, it is important to have a highly-oriented crystal structure at the time of Seed-Cu deposition and also to form the Seed-Cu film satisfying following conditions.

In other words, a Seed-Cu film highly oriented to Cu(111) is effective to suppress surface damage of the Cu redistribution layer, and it is desirable to have a Cu film having crystallinity with a strength ratio of Cu(111)/Cu(200)>200 in XRD measurement.

Therefore, in the present technology, crystallinity of Cu is controlled at the dime of forming the Ti/Cu film 49 in the course of forming the redistribution layer in the CSP 31. In other words, in the present technology, the crystallinity of Cu is controlled so as to be highly oriented at the time of forming the Ti/Cu film 49. Consequently, occurrence of Cu haze on the Cu surface can be suppressed.

Note that, as a redistribution layer forming method in the CSP 31, a semi-additive process different from a Cu damascene process used in a front-end process of a fine semiconductor process is used.

<Redistribution Layer Forming Processing>

Next, redistribution layer forming processing in the CSP 31 of FIG. 2 will be specifically described with reference to a flowchart in FIG. 3. Note that drawings of processes in FIGS. 4A 4B, 5A, 5B, and 5C will be used as appropriate for description.

The sensor substrate 43 and the Si substrate 46 are bonded to each other by processing in a preceding stage not illustrated, and the through-silicon via 47 is opened in the Si substrate 46 in order to form a redistribution layer in the wiring of the sensor substrate 43.

Figure 4A:
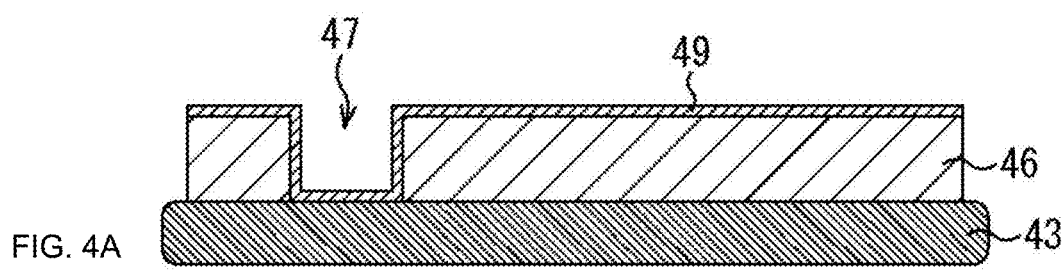
FIGS. 4A and 4B are views illustrating exemplary processes of the redistribution layer forming processing in FIG. 3.

In step S31, a manufacturing device forms the Ti/Cu film 49 corresponding to the barrier layer and the seed layer by Ti/Cu sputtering after opening the through-silicon via 47 (FIG. 4A). Meanwhile, wiring pattern processing is performed by a wet etching process in step S35 described later, and therefore, a Ta film used in the damascene process of the fine semiconductor process cannot be used and a Ti film that can be easily processed as a Cu diffusion barrier metal film is used in step S31 because it is difficult to apply wet processing to the Ta film.

Additionally, in step S31, the Seed-Cu film having high crystallinity is needed to be formed as described above in order to suppress occurrence of Cu haze after step S33 described later. In step S31, actually, degassing heating, reverse sputtering, Ti deposition, and Seed-Cu deposition are sequentially performed. The degassing heating is performed at a temperature equal to or less than a heat resistant temperature (about 200 degrees) of the transparent adhesive resin 42 that bonds the sensor substrate 43 to the protection glass 41. Next, the substrate surface is etched by about 10 nm in a thickness of an SiO2 film by performing the reverse sputtering, a surface oxide layer and processing residues of a lower layer Cu film (wiring layer of the sensor substrate 43) exposed to the bottom of the through-silicon via 47 are removed. Next, the Ti film of 250 nm is deposited, and a barrier layer is formed.

Next, the Seed-Cu film is deposited. As described above, the Seed-Cu film having high crystallinity is needed to be formed in order to suppress Cu haze. As a deposition method of the Seed-Cu film having high crystallinity, performing deposition at a temperature 60 degrees or more by heating the substrate temperature is one method. Since the deposition is performed at the substrate temperature of 60 degrees or more, the Seed-Cu film highly oriented to Cu(111) with a strength ratio of Cu(111)/Cu(200)≥200 is formed, and Cu haze is suppressed. The Cu wiring in which Cu haze is suppressed can be formed by performing subsequent steps S32 to S35 after above-described step S31.

Figure 4B:
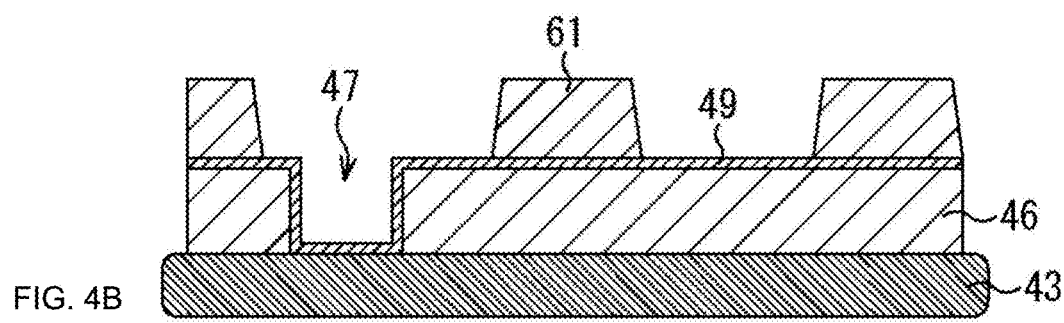

In step S32, the manufacturing device applies resist pattern 61 on the seed layer (FIG. 4B). Note that, in step S32, heating processing at about 130° C. is performed in order to harden the resist.

In step S33, the manufacturing device forms the plated Cu 50 while resist pattern 61 is applied.

Figure 5A:
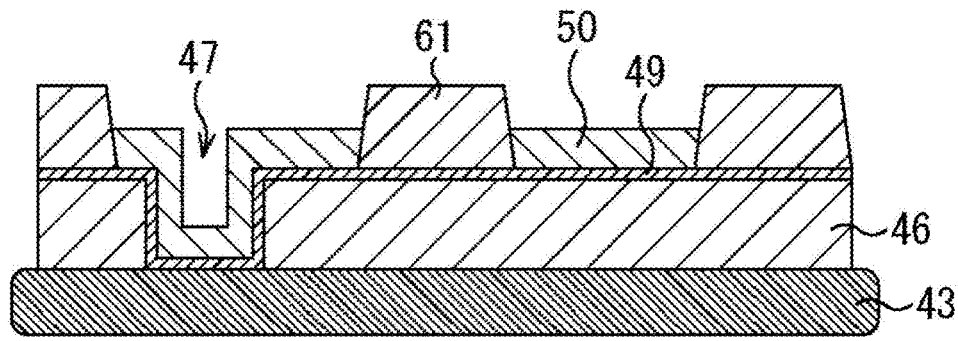
FIGS. 5A, 5B, and 5C are views illustrating exemplary processes of the redistribution layer forming processing in FIG. 3.

In step S34, the manufacturing device peels off the resist pattern 61 (FIG. 5A).

Figure 5B:
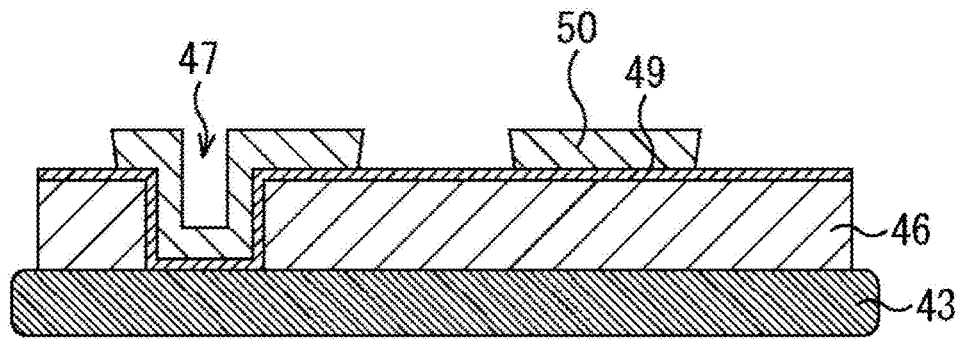
Figure 5C:
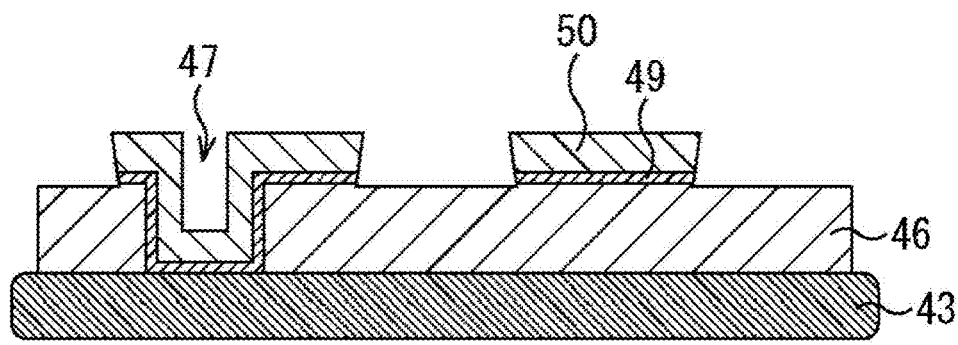

In step S35, the manufacturing device removes the Ti/Cu film 49 by the wet etching process. At this point, the Seed-Cu film as the seed layer is removed first, and then, the Ti film as the barrier layer is removed by using Seed-Cu as a mask (FIG. 5B).

With the above processes, the redistribution layer forming processing for the CSP 31 is completed, and the redistribution layer is formed.

Meanwhile, in the above description, a first method to increase the substrate temperature has been described, but as a second method to increase the substrate temperature, there is a method of increasing a deposition temperature by increasing kinetic energy of a sputtered material (Cu) colliding with the substrate by, for example, increasing target power, loading bias to be applied to the substrate, and the like besides heating to increase a substrate stage temperature.

Additionally, as the forming method for a Seed-Cu film in order to suppress Cu haze, a Seed-Cu film highly oriented to Cu(111) can be formed by depositing, as a base film, the Seed-Cu film on a Ti film highly oriented to the Ti(002). As a forming method of a highly-oriented Ti film on the Ti(002), it is also effective to: increase the substrate temperature during Ti deposition; increase target power during the deposition; and increase kinetic energy of a sputtered material (Ti) incident (deposited) on the substrate.

<Exemplary Effects>

Figure 3:
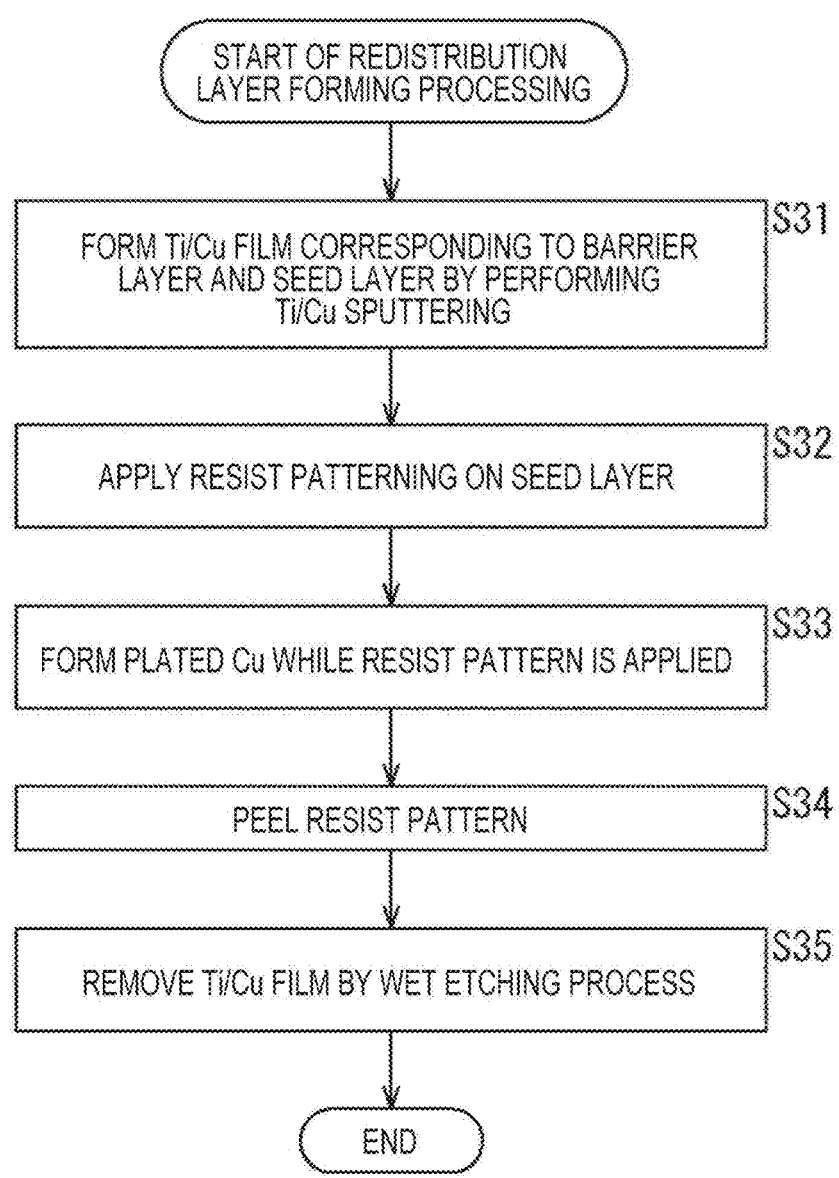
FIG. 3 is a flowchart illustrating a redistribution layer forming processing of the present technology.
Figure 6A:
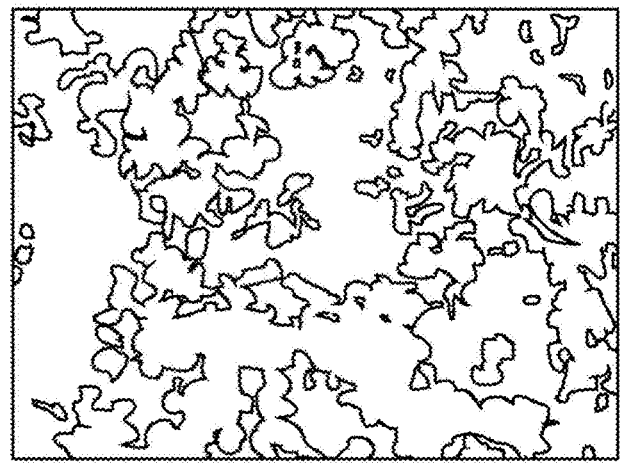
FIGS. 6A and 6B are views to describe effects.
Figure 6B:
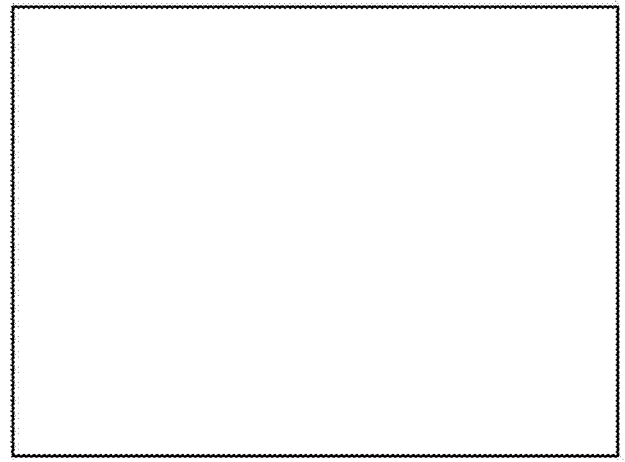

FIGS. 6A and 6B are views illustrating exemplary Cu surfaces after forming the plated Cu (step S33 in FIG. 3). Note that FIG. 6A illustrates an exemplary surface of a low-oriented Cu film in a case of the damascene process used in the front-end process of the fine semiconductor process, for example, and FIG. 6B illustrates an exemplary surface of a highly-oriented Cu film in a case of the present technology.

As illustrated in FIG. 6A and FIG. 6B, surface roughness of the Cu retribution layer can be suppressed by controlling crystallinity of the Cu film in a process of forming the barrier layer (Ti) and the plated power supply layer (Cu) in the course of forming the redistribution layer.

Figure 7A:
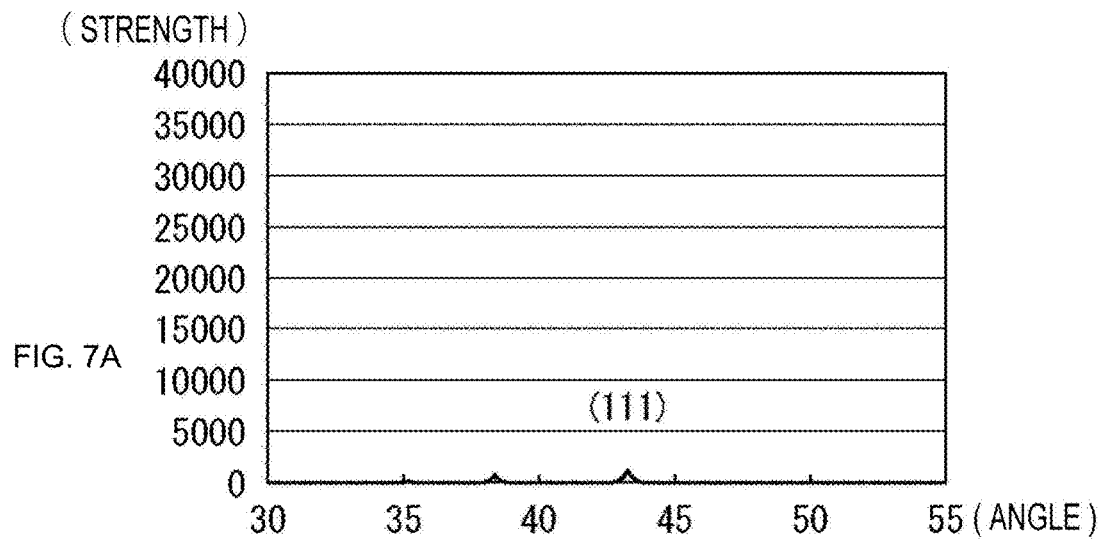
FIGS. 7A and 7B provide graphs to describe the effects.
Figure 7B:
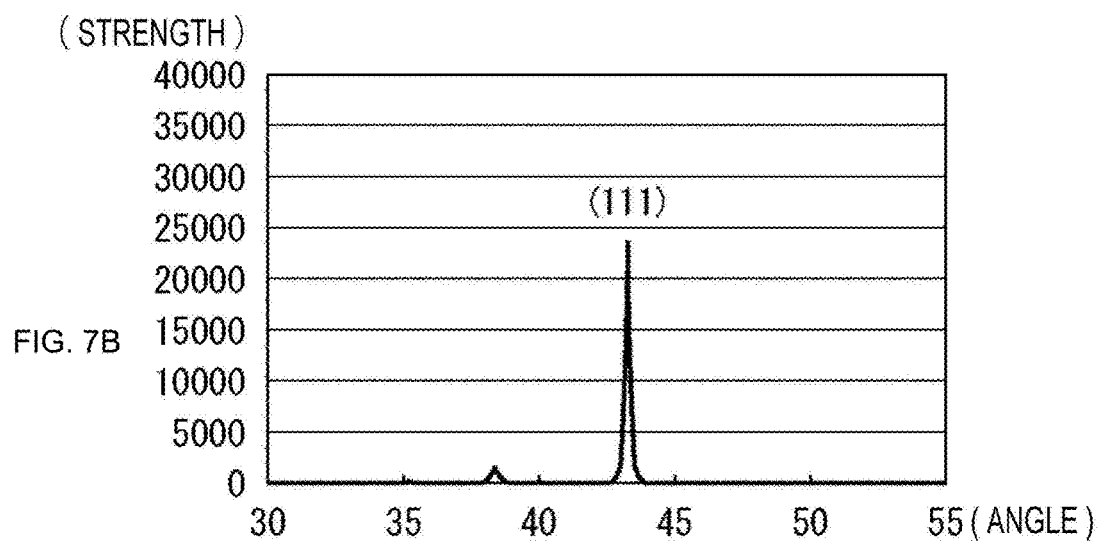

Additionally, FIGS. 7A and 7B provide graphs illustrating strength of Cu(111) of the plated power supply layer based on XRD measurement after deposition of the barrier layer and the plated power supply layer (step S31 in FIG. 3). In the example of FIGS. 7A and 7B, a vertical axis represents strength, and a horizontal axis represents a 2θ (θ: incident angle of X-ray). Meanwhile, FIG. 7A illustrates the strength of Cu(111) of the low-oriented Cu film in the case of the Cu damascene process used in the front-end process of the fine semiconductor process, and FIG. 7B illustrates the strength of Cu(111) of the highly-oriented Cu film in the case of the present technology.

In the process of forming the barrier layer (Ti) and the plated power supply layer (Cu) in the course of forming the redistribution layer, the strength of Cu(111) can be enhanced by controlling the crystallinity of the Cu film to the strength around 44 degrees of 2θ illustrated in FIG. 7A and FIG. 7B.

Figure 8A:
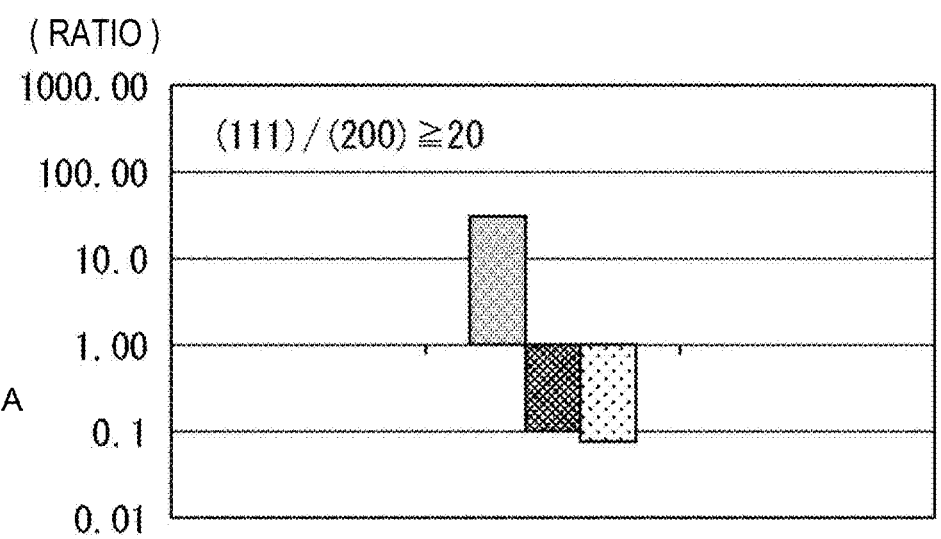
FIGS. 8A and 8B provide graphs to describe the effects.
Figure 8B:
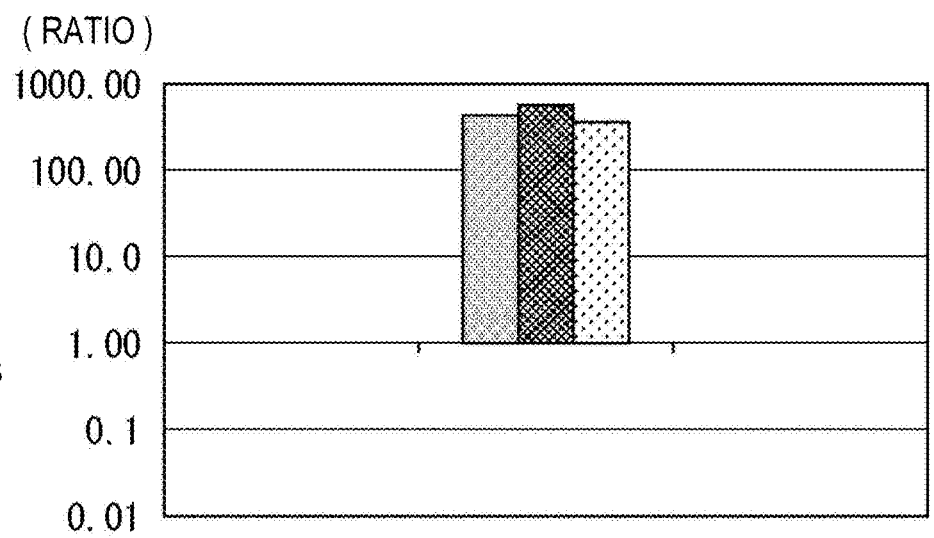

Furthermore, FIGS. 8A and 8B provide graphs illustrating a strength ratio between Cu(111) and Cu(200) of the plated power supply layer (Cu) based on the XRD measurement. In the example of FIGS. 8A and 8B, bar graphs represent, sequentially from a left side: a strength ratio after deposition of the barrier layer and the plated power supply layer (step S31 in FIG. 3); a strength ratio after application of a heat load for lithography (step S32 in FIG. 3); and a strength ratio after forming the plated Cu after (step S33 in FIG. 3).

Meanwhile, FIG. 8A illustrates the strength ratio between Cu(111) and Cu(200) of the low-orientated Cu film in the case of the Cu damascene process used in the front-end process of the fine semiconductor process, and FIG. 8B illustrates the strength ratio between Cu(111) and Cu(200) of the highly-oriented Cu film in the case of the present technology.

In the graph of FIG. 8A, the strength ratio after deposition of the barrier layer and the plated power supply layer is 20 or more, but the strength ratio is decreased to 1 or less in the subsequent processes, and the crystallinity of Cu is largely changed. As a result, as illustrated in FIG. 6A, the Cu surface after being plated is noticeably roughened and results in Cu haze.

On the other hand, in the graph of FIG. 8B, the strength ratio after deposition of the barrier layer and the plated power supply layer is 200 or more, and there is little change made by the processing in the subsequent processes. In other words, the crystallinity of Cu is not changed and Cu haze is suppressed as illustrated in FIG. 6B.

As described above, in the process of forming the barrier layer (Ti) and the plated power supply layer (Seed-Cu film) at the time of forming the redistribution layer, the surface roughness of the Cu redistribution layer can be suppressed by controlling the crystallinity of the Cu film.

In other words, the surface roughness of the Cu redistribution layer can be suppressed because the crystallinity of the Cu film of the seed layer is highly oriented by increasing the substrate temperature to a high temperature (e.g., 60 degrees or more) at the time of forming the Cu film of the seed layer, for example.

Note that, in the above description, the configuration in which the present technology is applied to the CMOS solid-state image sensing device has been described, but the present technology may also be applied to a solid-state image sensing device such as a charge coupled device (CCD) solid-state image sensing device.

2. Second Embodiment (Exemplary Uses of Image Sensor)

Figure 9:
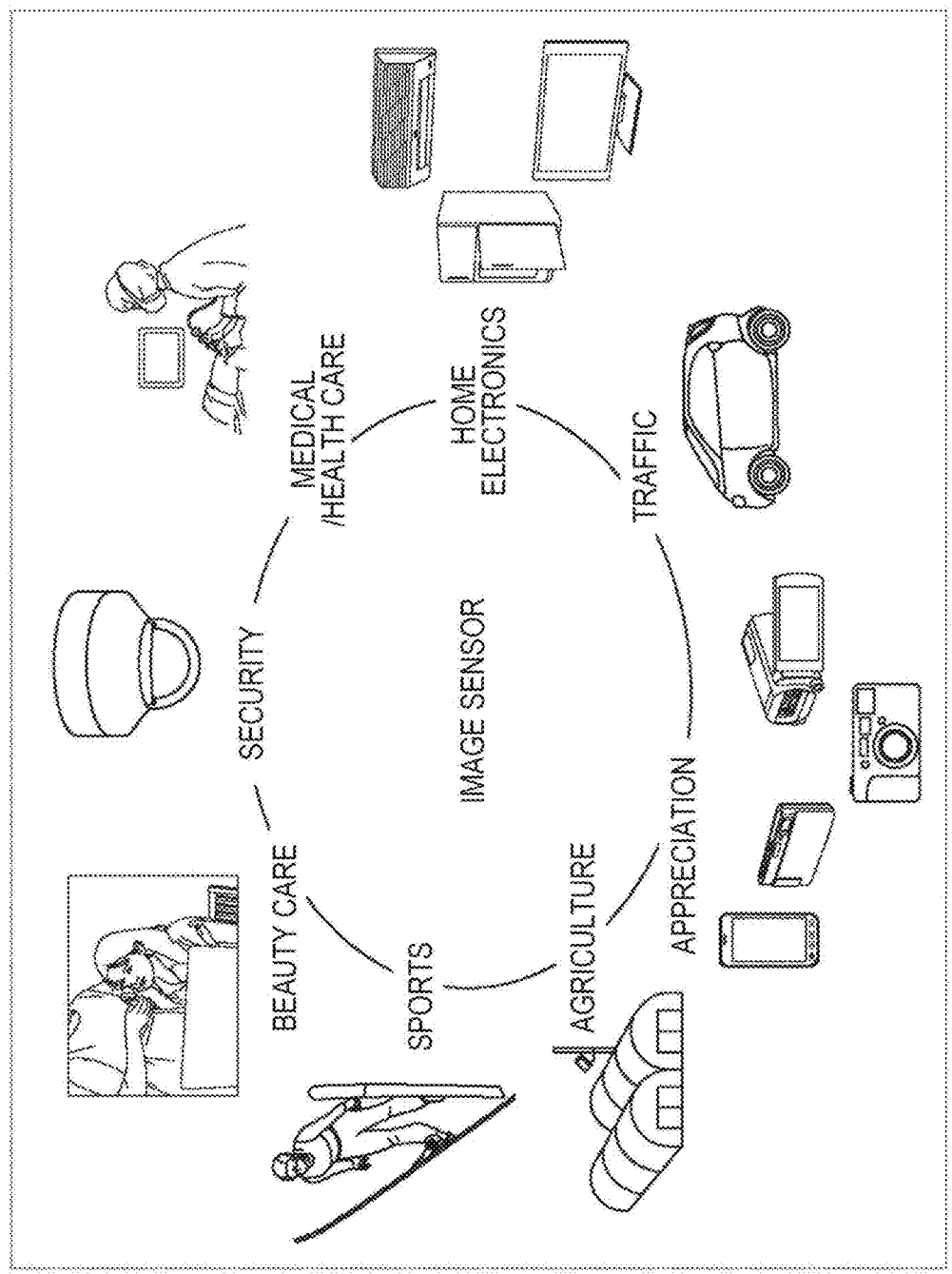
FIG. 9 is a diagram illustrating an exemplary structure of a solid-state image sensing device to which the present technology is applied.

FIG. 9 is a diagram illustrating exemplary uses in which a solid-state image sensing device described above is used.

The above-described solid-state image sensing device (image sensor) can be used in various cases of sensing light such as visible light, infrared light, ultraviolet light, and X-rays as described below, for example.

Device adapted to image an image provided for image appreciation, such as a digital camera, a portable device incorporated with a camera function, and the like Device provided for traffic, such as an on-vehicle sensor adapted to image a front side, a rear side, a periphery of a vehicle, a car interior, and the like, a monitoring camera adapted to monitor a traveling vehicle and a road, and a ranging sensor adapted to measure a distance between vehicles in order to perform safety drive like automatic stop recognize driver's condition and the like Device provided for home electronics such as a television, a refrigerator, and an air conditioner in order to image a user' s gesture and operate the electric appliances in accordance with the gesture Device provided for medical and health care, such as an endoscope and a device adapted to image a blood vessel by receiving infrared light Device provided for security, such as a monitoring camera for crime prevention, and a camera for person authentication Device provided for beauty care, such as skin measurement instrument adapted to image skin, and a microscope adapted to image a scalp Device provided for sport and the like, such as an action camera and a wearable camera used in sports Device provided for agriculture, such as a camera to monitor condition of fields and crops.

3. Third Embodiment (Exemplary Electronic Apparatus)

<Exemplary Configuration of Electronic Apparatus>

Furthermore, application of the present technology is not limited to a solid-state image sensing device, and application to an imaging device is also possible. Here, the imaging device represents a camera system such as a digital still camera or a digital video camera, or an electronic apparatus having an imaging function, such as a mobile phone. Note that there may be a case where a module-like embodiment mounted on an electronic apparatus, that is, a camera module is used as an imaging device.

Here, an exemplary configuration of the electronic apparatus of the present technology will be described with reference to FIG. 10.

Figure 10:
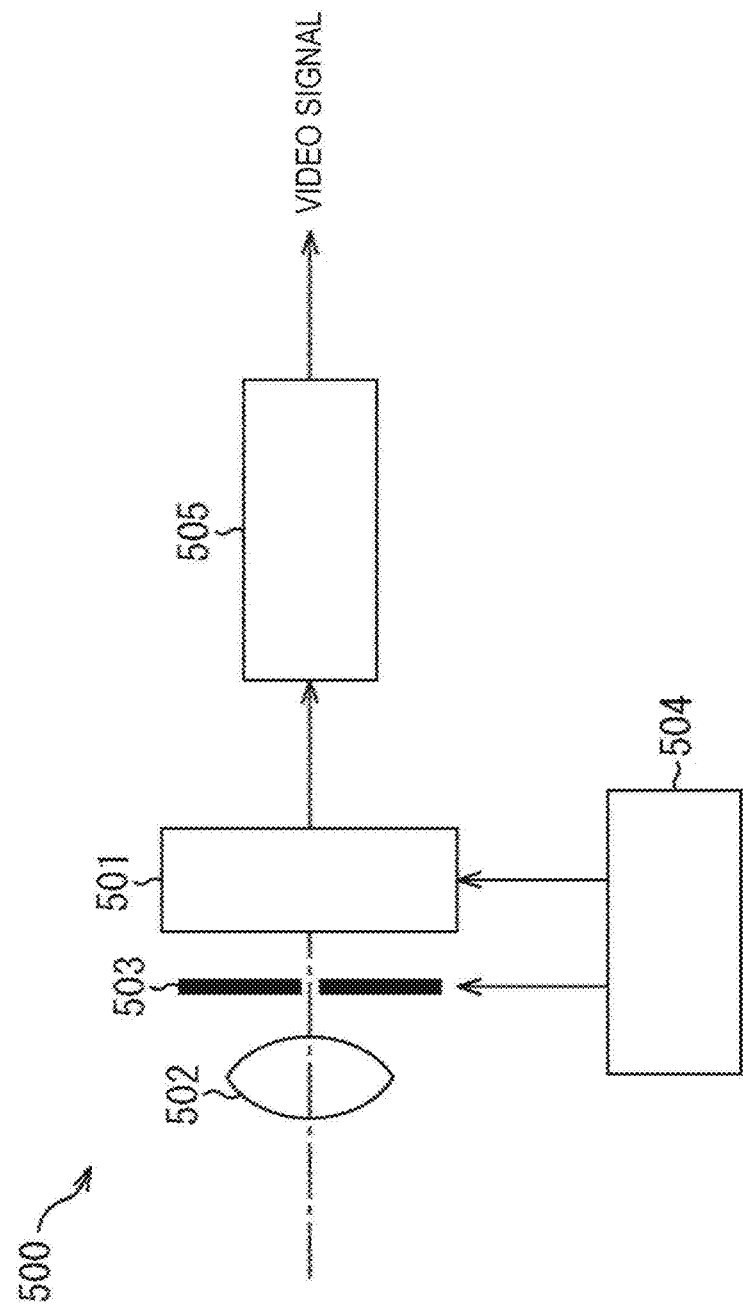
FIG. 10 is a block diagram illustrating an exemplary configuration of an electronic apparatus to which the present technology is applied.

An electronic apparatus 500 illustrated in FIG. 10 includes a solid-state image sensing device (element chip) 501, an optical lens 502, a shutter device 503, a drive circuit 504, and a signal processing circuit 505. As the solid-state image sensing device 501, a solid-state image sensing device 1 of an above-described first embodiment of the present technology is provided. With this configuration, Cu haze of a Cu surface of the solid-state image sensing device 501 in the electronic apparatus 500 can be suppressed.

The optical lens 502 forms an image on the basis of imaging light (incident light) emitted from a subject on an imaging surface of the solid-state image sensing device 501. Consequently, signal charge is accumulated in the solid-state image sensing device 501 for a certain period. The shutter device 503 controls a light irradiation period and alight shielding period for the solid-state image sensing device 501.

The drive circuit 504 supplies a drive signal to control signal transfer operation of the solid-state image sensing device 501 and shutter operation of the shutter device 503.

The solid-state image sensing device 501 performs signal transfer in accordance with a drive signal (timing signal) supplied from the drive circuit 504. The signal processing circuit 505 applies various kinds of signal processing to the signal output from the solid-state image sensing device 501. A video signal subjected to the signal processing is stored in a storage medium such as a memory or output to a monitor.

Meanwhile, in the present specification, the steps specifying the above-described series of processing are intended to include, of course, the processing performed in a time-series in accordance with the described order and also processing executed in parallel or individually although not executed in a time-series.

Additionally, the embodiments of the present disclosure are not limited to the above-described embodiments, and various kinds of modifications can be made within a range not departing from the gist of the present disclosure.

Furthermore, the configuration described as one device (or one processing unit) in the above description may be divided and may be formed as a plurality of devices (or processing units). In contrast, the configuration described as the plurality of devices (or processing units) in the above description may be integrated as one device (or one processing unit). Additionally, needless to mention, a configuration other than those described above may be added to the configuration of each device (or each processing unit). Furthermore, as far as a configuration and operation of an entire system are substantially the same, a part of a configuration of a certain device (or processing unit) may be included in a configuration of another device (or another processing unit). In other words, the present technology is not limited to the above-described embodiments and various kinds of modifications can be made within the range not departing from the gist of the present technology.

While the preferred embodiments of the present disclosure have been described above in detail with reference to the attached drawings, the technical scope of the present disclosure is not limited to such examples. It is obvious that various modified examples or revised examples are readily conceivable within the scope of the technical idea described in the claims on the basis of ordinary knowledge in the technical field to which the present disclosure belongs, and it should be understood that such examples are also included in the technical scope of the present disclosure as a matter of course.

Note that the present technology may also adopt the following configurations.

(1) A solid-state image sensing device including, as a redistribution layer, a barrier layer and a plated power supply layer,
in which crystallinity of a film of the plated power supply layer is controlled at the time of depositing a film of the barrier layer and the film of the plated power supply layer.

(2) The solid-state image sensing device recited in (1) above, in which
the film of the barrier layer is a Ti film, and
the film of the plated power supply layer is a Cu film.

(3) The solid-state image sensing device recited in (2) above, in which the Cu film is highly oriented to Cu(111).

(4) The solid-state image sensing device recited in (2) above, in which the Cu film has crystallinity with a strength ratio of Cu(111)/Cu(200)≥200.

(5) The solid-state image sensing device recited in any one of (2) to (4) above, in which the Cu film is deposited at a substrate temperature of 60 degrees or more.

(6) The solid-state image sensing device recited in (5) above, in which the substrate temperature is increased by heating the substrate temperature to 60 degrees or more.

(7) The solid-state image sensing device recited in (5) above, in which the substrate temperature is increased by setting target power to high power.

(8) The solid-state image sensing device recited in (5) above, in which the substrate temperature is increased by applying bias to the substrate to cause sputter ions entering the substrate to have high energy.

(9) The solid-state image sensing device recited in (2) to (8) above, in which
the Ti film is highly oriented to Ti(002), and
the Cu film is deposited on the Ti film.

(10) A manufacturing method to control crystallinity of a film of a plated power supply layer when a manufacturing device of a solid-state image sensing device deposits a film of a barrier layer and the film of the plated power supply layer in a course of forming a redistribution layer.

(11) An electronic apparatus including a barrier layer and a plated power supply layer as redistribution layers,
in which provided are:
a solid-state image sensing device in which crystallinity of a film of the plated power supply layer is controlled at the time of depositing a film of the barrier layer and the film of the plated power supply layer;
a signal processing circuit adapted to process an output signal output from the solid-state image sensing device; and
an optical system adapted to allow incident light to enter the solid-state image sensing device.

REFERENCE SIGNS LIST

1 Solid-state image sensing device
2 Pixel
31 CSP
41 Protection glass
42 Transparent adhesive resin
43 Sensor substrate
44 Interlayer film
45 Wiring
46 Si substrate
47 Through-silicon via
48 Insulation film
49 Ti/Cu film
50 Plated Cu
51 Insulation film
52 Solder ball
61 Resist pattern
500 Electronic apparatus
501 Solid-state image sensing device
502 Optical lens
503 Shutter device
504 Drive circuit
505 Signal processing circuit

The invention claimed is:
1. A solid-state image sensing device, comprising:
a redistribution layer that includes a barrier layer and a plated power supply layer, wherein
crystallinity of a film of the plated power supply layer is controlled during deposition of a film of the barrier layer and the film of the plated power supply layer, and
thickness of the barrier layer is 250 nm.

2. The solid-state image sensing device according to claim 1, wherein the film of the barrier layer is a Titanium (Ti) film, and the film of the plated power supply layer is a Copper (Cu) film.

3. The solid-state image sensing device according to claim 2, wherein the Cu film is highly oriented to Cu(111).

4. The solid-state image sensing device according to claim 2, wherein the Cu film has crystallinity with a strength ratio of Cu(111)/Cu(200)>=200.

5. The solid-state image sensing device according to claim 2, wherein the Cu film is deposited at a substrate temperature of 60 degrees or more.

6. The solid-state image sensing device according to claim 5, wherein the substrate temperature is increased based on an application of bias to a substrate, wherein the application of the bias increases energy of sputter ions that enter the substrate.

7. The solid-state image sensing device according to claim 2, wherein the Ti film is highly oriented to Ti(002), and the Cu film is deposited on the Ti film.

8. A manufacturing method, comprising:
depositing, a film of a barrier layer and a film of a plated power supply layer to form a redistribution layer, wherein
crystallinity of the film of the plated power supply layer is controlled during the deposition of the barrier layer and the film of the plated power supply layer, and
thickness of the barrier layer is 250 nm.

9. An electronic apparatus, comprising:
a solid-state image sensing device that comprises a redistribution layer, wherein the redistribution layer includes a barrier layer and a plated power supply layer, wherein
crystallinity of a film of the plated power supply layer is controlled during deposition of a film of the barrier layer and the film of the plated power supply layer, and
thickness of the barrier layer is 250 nm;
a signal processing circuit configured to process an output signal received from the solid-state image sensing device; and
an optical system configured to allow incident light to enter the solid-state image sensing device.

* * * * *